(12) United States Patent
Eleftheriou et al.

(10) Patent No.: US 10,217,046 B2
(45) Date of Patent: Feb. 26, 2019

(54) NEUROMORPHIC PROCESSING DEVICES

(71) Applicant: INTERNATIONAL BUSINESS MACHINES CORPORATION, Armonk, NY (US)

(72) Inventors: Evangelos S. Eleftheriou, Rueschlikon (CH); Manuel Le Gallo, Rueschlikon (CH); Angeliki Pantazi, Rueschlikon (CH); Abu Sebastian, Rueschlikon (CH); Tomas Tuma, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 762 days.

(21) Appl. No.: 14/933,384

(22) Filed: Nov. 5, 2015

(65) Prior Publication Data
US 2016/0379110 A1 Dec. 29, 2016

Related U.S. Application Data

(60) Provisional application No. 62/185,735, filed on Jun. 29, 2015.

(51) Int. Cl.
G06N 3/063 (2006.01)
G06N 3/04 (2006.01)

(52) U.S. Cl.
CPC .......... *G06N 3/0635* (2013.01); *G06N 3/049* (2013.01)

(58) Field of Classification Search
None
See application file for complete search history.

(56) References Cited

U.S. PATENT DOCUMENTS 9,837,147 B2 * 12/2017 Ge ................... G11C 13/0002
2012/0011092 A1 * 1/2012 Tang ....................... G06N 3/049
706/33
(Continued)

FOREIGN PATENT DOCUMENTS

| CN | 103430186 A | 12/2013 |
|---|---|---|
| CN | 104685516 A | 6/2015 |

OTHER PUBLICATIONS

Al-Shedivat, Maruan et al.; Inherently Stochastic Spiking Neurons for Probabilistic Neural Comutation; 2015 IEEE EMBS Conference on Neural Engineering; pp. 356-359. (Year: 2015).*

(Continued)

*Primary Examiner* — Stanley K. Hill
(74) *Attorney, Agent, or Firm* — Cantor Colburn LLP; Daniel Morris

(57) ABSTRACT

A neuromorphic processing device has a device input, for receiving an input data signal, and an assemblage of neuron circuits. Each neuron circuit comprises a resistive memory cell which is arranged to store a neuron state, indicated by cell resistance, and to receive neuron input signals for programming cell resistance to vary the neuron state, and a neuron output circuit for supplying a neuron output signal in response to cell resistance traversing a threshold. The device includes an input signal generator, connected to the device input and the assemblage of neuron circuits, for generating neuron input signals for the assemblage in dependence on the input data signal. The device further includes a device output circuit, connected to neuron output circuits of the assemblage, for producing a device output signal dependent on neuron output signals of the assemblage, whereby the processing device exploits stochasticity of resistive memory cells of the assemblage.

14 Claims, 9 Drawing Sheets

(56) References Cited

U.S. PATENT DOCUMENTS

| | | |
|---|---|---|
| 2012/0084240 A1 | 4/2012 | Esser et al. |
| 2012/0084241 A1 | 4/2012 | Friedman et al. |
| 2012/0096234 A1* | 4/2012 | Jiang .................. G11C 11/5678 711/170 |
| 2012/0317063 A1 | 12/2012 | Sim et al. |
| 2013/0262358 A1 | 10/2013 | Heliot et al. |
| 2013/0311415 A1 | 11/2013 | Nishitani et al. |
| 2014/0052679 A1 | 2/2014 | Sinyavskiy et al. |
| 2015/0006455 A1 | 1/2015 | Suri et al. |

OTHER PUBLICATIONS

Thomas, Andy; Memristor-based neural networks; IOP Publishing; 2013; J. Phys. D: Appl. Phys. 46 (2013); pp. 1-12. (Year: 2013).*
Naous, Rawan et al.; Memristor-based neural networks: Synaptic versus neuronal stochasticity; Crossmark; AIP Advances 6, 111304 (2016); 7 pages. (Year: 2016).*
International Search Report and Written Opinion for International Application No. PCT/IB2016/053353, filed Jun. 8, 2016; ISR dated Sep. 22, 2016; 13 pgs.

* cited by examiner

NEUROMORPHIC PROCESSING DEVICES

DOMESTIC PRIORITY

This application claims the benefits of the legally related U.S. Provisional Patent Application Ser. No. 62/185,735 filed Jun. 29, 2015, which is fully incorporated herein by reference.

BACKGROUND

The present invention relates generally to neuromorphic processing devices, and more particularly to such devices employing assemblages of neuron circuits based on resistive memory cells.

Neuromorphic technology relates to computing systems which are inspired by biological architectures of the nervous system. The conventional computing paradigm based on CMOS logic and von Neumann architecture is becoming increasingly inadequate to meet the expanding processing demands placed on modern computer systems. Compared to biological systems, it is also highly inefficient in terms of power consumption and space requirements. These issues have prompted a significant research effort to understand the highly efficient computational paradigm of the human brain and to create artificial cognitive systems with unprecedented computing power.

Neurons, along with synapses, are basic computational units in the brain. A neuron can integrate the input signals it receives. In biological neurons, a thin lipid-bilayer membrane is used to separate the electrical charge inside of the cell from that outside of it. The membrane potential, which represents the stored neuron state, is progressively modified by the arrival of neuron input signals. When the membrane potential traverses a specific voltage threshold, the neuron will "fire", generating an output signal known as an "action potential" or "spike", and then revert to its initial state. These spikes are conveyed to other neurons via synapses which change their connection strength ("plasticity" or "synaptic weight") as a result of neuronal activity.

Most current artificial neuron realizations are based on hybrid analog/digital VLSI circuits and require several transistors to be realized. Emulating the integrate-and-fire neuronal functionality with conventional CMOS circuits, such as current-mode, voltage-mode and subthreshold transistor circuits, is relatively complex and hinders seamless integration with highly-dense synaptic arrays. Moreover, conventional CMOS solutions rely on storing the membrane potential in a capacitor. Even with a drastic scaling of the technology node, realizing the capacitance densities measured in biological neuronal membranes (approximately 10 fF/µm2) is challenging.

Resistive memory cells such as phase change memory (PCM) cells have been recognized as suitable candidates for the realization of neural hardware (see e.g. "The Ovonic Cognitive Computer—A New Paradigm", Ovshinsky, Proc. E/PCOS, 2004, and "Novel Applications Possibilities for Phase-Change Materials and Devices", Wright et al., Proc. E/PCOS, 2013). Resistive memory cells are programmable-resistance devices which rely on the variable resistance characteristics of a volume of resistive material disposed between a pair of electrodes. These cells are memristors, i.e., devices that remember the history of the current that has flowed through them. While scalable and efficient memristive synapses have been demonstrated, concrete realizations for practical artificial neurons that can capture most of the essential attributes of biological neurons are more challenging.

In addition to the deterministic neuronal dynamics, stochastic neuronal dynamics play a key role in signal encoding and transmission in biological systems. IEEE JESTCS, Vol. 5, No. 2, June 2015, "Memristors Empower Spiking Neurons With Stochasticity", Al-Shedivat et al., discloses use of a metal-oxide memristor to artificially inject intra-neuron stochasticity in a circuit neuron implementation.

SUMMARY

According to at least one embodiment of the present invention there is provided a neuromorphic processing device. The device has a device input for receiving an input data signal, and an assemblage of neuron circuits. Each neuron circuit comprises a resistive memory cell which is arranged to store a neuron state, indicated by cell resistance, and to receive neuron input signals for programming cell resistance to vary the neuron state, and a neuron output circuit for supplying a neuron output signal in response to cell resistance traversing a threshold. The device includes an input signal generator, connected to the device input and the assemblage of neuron circuits, for generating neuron input signals for the assemblage in dependence on the input data signal. The device further includes a device output circuit, connected to neuron output circuits of the assemblage, for producing a device output signal dependent on neuron output signals of the assemblage, whereby the processing device exploits stochasticity of resistive memory cells of the assemblage.

Embodiments of the invention will be described in more detail below, by way of illustrative and non-limiting example, with reference to the accompanying drawings.

DETAILED DESCRIPTION

Figure 1:
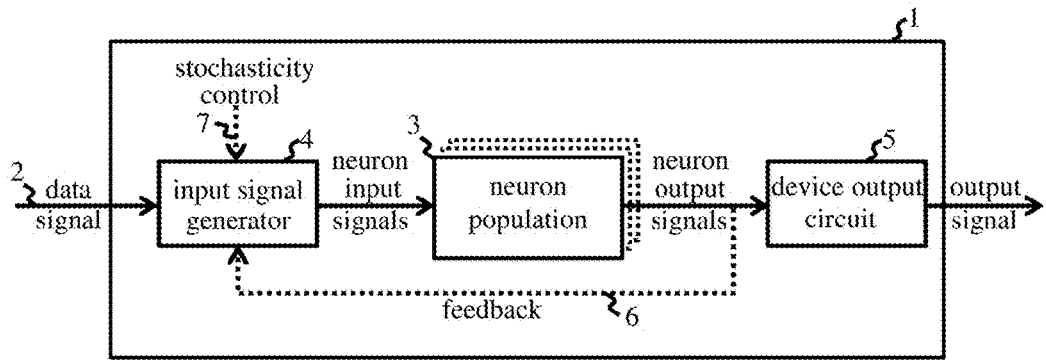
FIG. 1 is a schematic representation of a neuromorphic processing device embodying the invention.

FIG. 1 shows a neuromorphic processing device 1 embodying the invention, having a device input 2 for receiving an input data signal to be processed. The device 1 includes an assemblage 3 of neuron circuits, also referred to herein as a "population" of neurons by analogy with biological systems. As indicated by the dashed blocks in the figure, assemblage 3 may in general comprise a single neuron population or a plurality of component populations, or "sub-assemblages", as discussed further below. An input signal generator 4 is connected to the device input 2 and the assemblage 3 of neuron circuits. The input signal generator 4 is operable to generate neuron input signals for neuron assemblage 3 in dependence on the input data signal in operation. A device output circuit 5 is connected to neuron assemblage 3 for receiving neuron output signals from neuron circuits of the assemblage. The device output circuit 5 is operable to produce a device output signal, dependent on neuron output signals of the assemblage, in operation.

As indicated by dashed arrow 6 FIG. 1, in some embodiments the input signal generator 4 may be responsive to neuron output signals of the assemblage. In such embodiments, input signal generator 4 can be adapted to control generation of neuron input signals for the assemblage in dependence on neuron output signals. As another optional feature, the input signal generator may be responsive to a stochasticity control input indicated by dashed arrow 7. Input signal generator 4 can then be adapted to control generation of neuron input signals for the assemblage in dependence on control input 7. These optional features are discussed further below.

Figure 2:
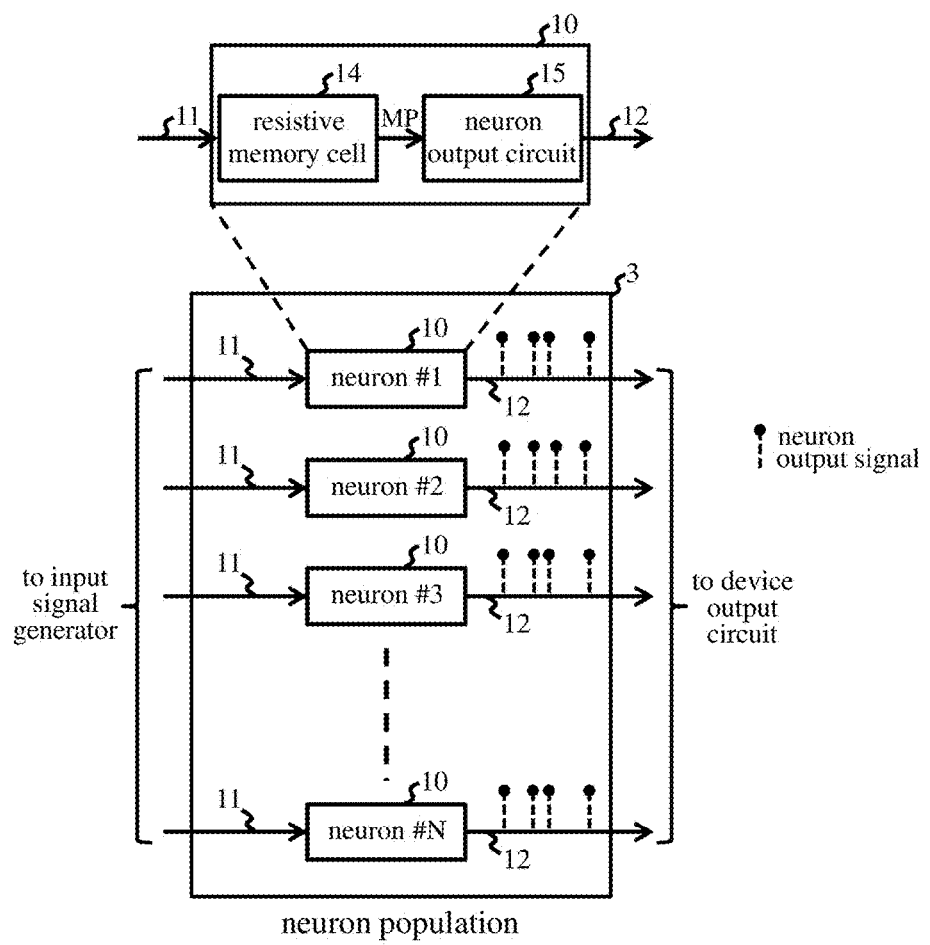
FIG. 2 illustrates a neuron circuit assemblage of the FIG. 1 device.

FIG. 2 is a schematic illustration of one embodiment of neuron assemblage 3. This comprises a single neuron population containing a multiplicity N of neuron circuits 10, each having an input 11 and an output 12. The number N of neuron circuits in the population may vary for different applications. A typical population may contain at least tens of neurons, and more usually at least hundreds of neurons. The neuron inputs 11 and neuron outputs 12 are connected to input signal generator 4 and device output circuit 5 respectively. (Though shown in simple form in the schematics, in practice the inputs 11 and outputs 12 of population 3 may be connected to components 4, 5 directly or indirectly, e.g. via one or more intervening components such as switches, etc.). Each neuron circuit 10 comprises a resistive memory cell 14 and a neuron output circuit 15. As illustrated by examples below, the resistive memory cell 14 of each neuron circuit 10 is arranged to store a neuron state, or "membrane potential" (MP), which is indicated by cell resistance. The memory cell 14 is further arranged to receive neuron input signals, supplied by input signal generator 4 on neuron input 11, for programming the cell resistance to vary the neuron state. The neuron output circuit 15 is adapted for supplying a neuron output signal, on neuron output 12, in response to cell resistance traversing a threshold as described below. Each neuron output signal represents a spike event corresponding to firing of the neuron.

In operation of processing device 1, the data signal to be processed is supplied to device input 2, and input signal generator 4 generates neuron input signals which are applied to the memory cells 14 of neuron population 3 to vary the neuron states. These neuron input signals are dependent on the input data signal. Hence, one or more attributes of the neuron input signals are determined by signal generator 4 in dependence on one or more attributes of the input data signal. The individual neuron circuits will fire, generating neuron output signals (spikes), if resistance of their respective memory cells 14 traverses the threshold level. The device output circuit 5 receives the neuron output signals and produces the device output signal in dependence thereon. That is, one or more attributes of the device output signal are determined by output circuit 5 in dependence on one or more attributes of the collective output of neuron population 3.

In a typical application, the individual neuron circuits 10 will receive a succession of neuron input signals from signal generator 4. Successive input signals to any given neuron 10 can then progressively vary the cell resistance. In particular, input signal generator 4 is preferably adapted to periodically generate neuron input signals for assemblage 3, controlling at least one attribute of each neuron input signal in dependence on the input data signal. Thus, neuron input signals are varied with time in dependence on the input data signal. In embodiments detailed below, each neuron input signal comprises a programming pulse and input signal generator 4 controls at least one programming pulse attribute in dependence on at least one time-dependent attribute of the input data signal. For example, one or more of the amplitude, duration (e.g. pulse width), power, trailing-edge shape, or number of component pulses of the overall programming pulse may be controlled by signal generator 4. Successive programming pulses are thus varied in dependence on temporal variations in the input data signal. The device output circuit 5 may be adapted to control at least one attribute of the device output signal in dependence on rate of receipt by the device output circuit 5 of neuron output signals from population 3. The neuron circuits 10 of preferred embodiments are capable of a series of accumulation/fire cycles, i.e. progressive variation in cell resistance resulting in generation of an output spike. In particular, the neuron output circuit 15 of each neuron 10 is operable to control reset of the cell resistance to an initial (pre-accumulation) neuron state in response to cell resistance traversing the threshold, and the consequent spike event. This can be achieved by selective application, via the neuron output circuit, of a reset pulse to the memory cell as described further below.

The precise operational details of input signal generator 4 and device output circuit 5 will depend on the particular processing operation to be performed, and examples are described further below. In general, however, by programming resistive memory cells of the assemblage in dependence on the input data signal, and producing the device output signal based on neuron outputs of the assemblage, the processing device 1 exploits stochasticity of the resistive memory cells of the assemblage in the signal processing operation. The resistive memory cells both store the neuron state and contribute stochastic effects, both intra-neuron and inter-neuron, which are exhibited in the collective output of the neuron population. Embodiments of the invention thus offer efficient neuromorphic processing devices exploiting stochastic behaviour of neuron populations, in direct analogy to biological systems where virtually all information is encoded using populations of cells rather than single cells.

Figure 3:
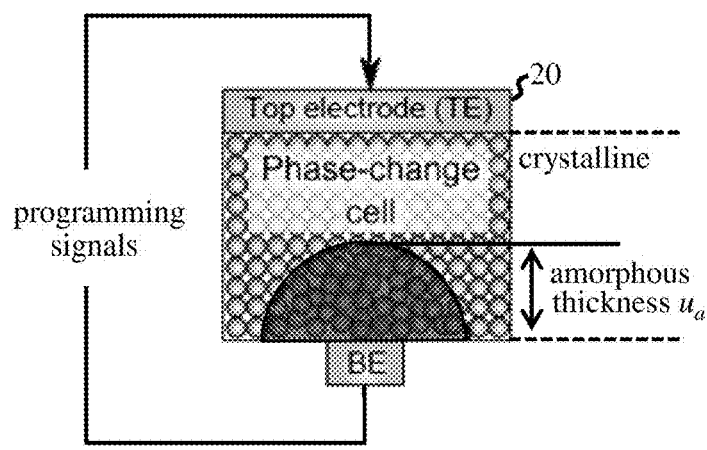
FIG. 3 is a schematic representation of a PCM cell for use in neuron circuits of the assemblage.

In the examples to follow, the resistive memory cells in neuron circuits 10 are PCM cells. In these PCM-based neurons, the core idea is to emulate the neuron state, i.e. the neuronal membrane potential, by means of the phase configuration within a nanoscale phase-change device. This phase-change device consists of a nanometric volume of phase-change material sandwiched between two electrodes. This phase configuration will be varied over time based on the neuron input signals. A schematic illustration of a PCM cell, here of the "mushroom-cell" type, is shown in FIG. 3. The PCM cell 20 comprises a volume of chalcogenide material such as GST (Germanium-Antimony-Tellurium) disposed between a first, "top" electrode (TE) and a second, "bottom" electrode (BE). The smaller, bottom electrode serves as a heater for heating the chalcogenide via application of programming pulses to the electrodes. In an as-fabricated device, the chalcogenide material is in the (low-resistance) crystalline phase. To create a (high-resistance) amorphous region within the crystalline matrix, a voltage pulse of sufficiently high amplitude (referred to as a reset pulse) is applied such that the resulting Joule heating, induced by current flowing through the cell, will melt a substantial portion of the phase-change material. If the pulse is cut off abruptly, the molten material will rapidly quench into the amorphous phase because of glass transition. This creates a region of high-resistance amorphous material within the otherwise crystalline chalcogenide as shown in the figure. The effective thickness, ua, of this amorphous region is a measure of the phase configuration within the device. In this state, if a voltage less than a certain threshold switching voltage is applied to the cell via the electrodes, the current will be so small that there will be very little Joule heating and substantially no phase change in the cell volume. However, application of a programming ("write") pulse above the threshold voltage (but less than the reset-pulse amplitude such that the temperature reached within the device is below the melting temperature), the resulting Joule heating will induce crystal growth in the cell, and the amorphous thickness ua decreases. The extent of crystallization can be controlled by varying attributes, e.g. power and duration, of the crystallizing pulse. Successive applications of crystallizing pulses will result in progressively decreasing ua. As ua decreases, the electrical resistance of the cell decreases. The cell resistance can be measured by applying a low-voltage "read signal" to the electrodes and measuring the resulting current flow through the cell. The read voltage level is low enough that the read operation does not disturb the programmed cell-state.

Figure 4A:
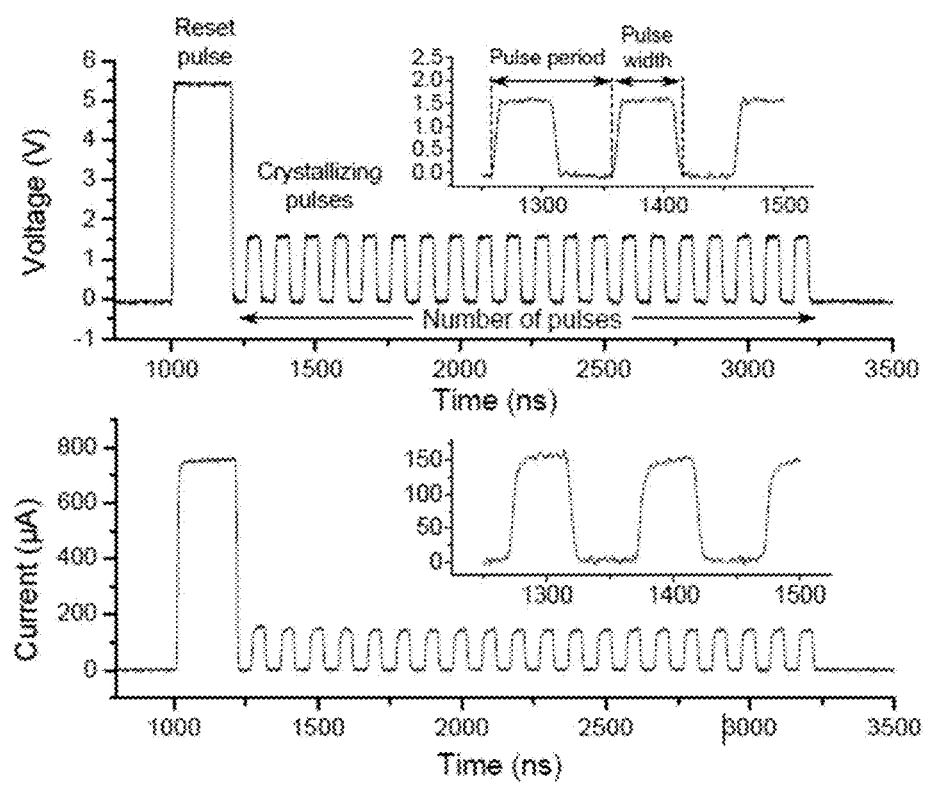
FIGS. 4a through 4c indicate operating characteristics of neuron circuits using PCM cells.
Figure 4B:
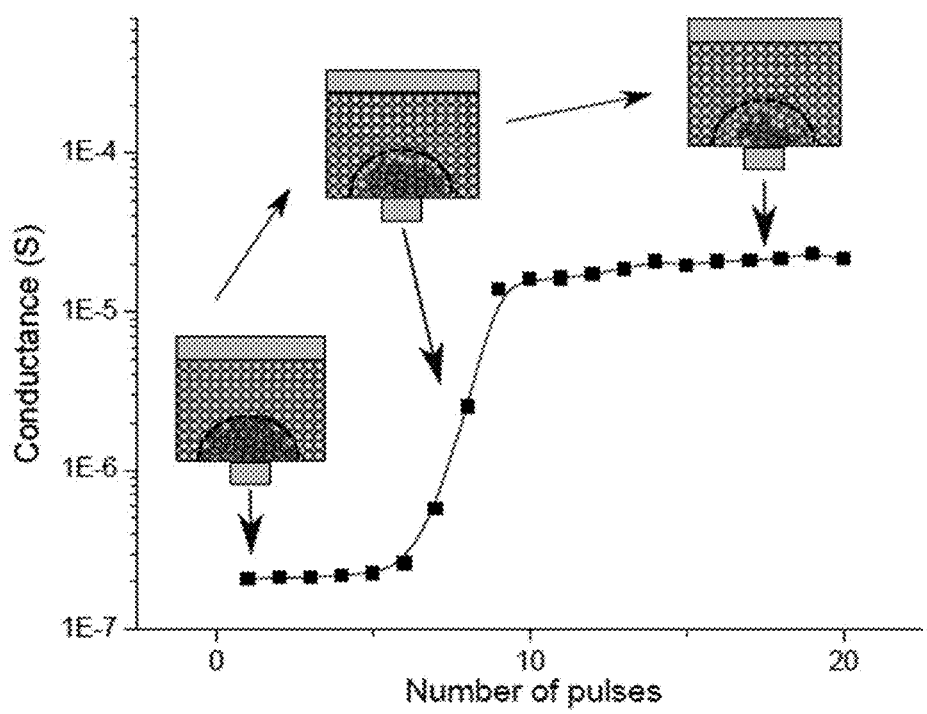
Figure 4C:
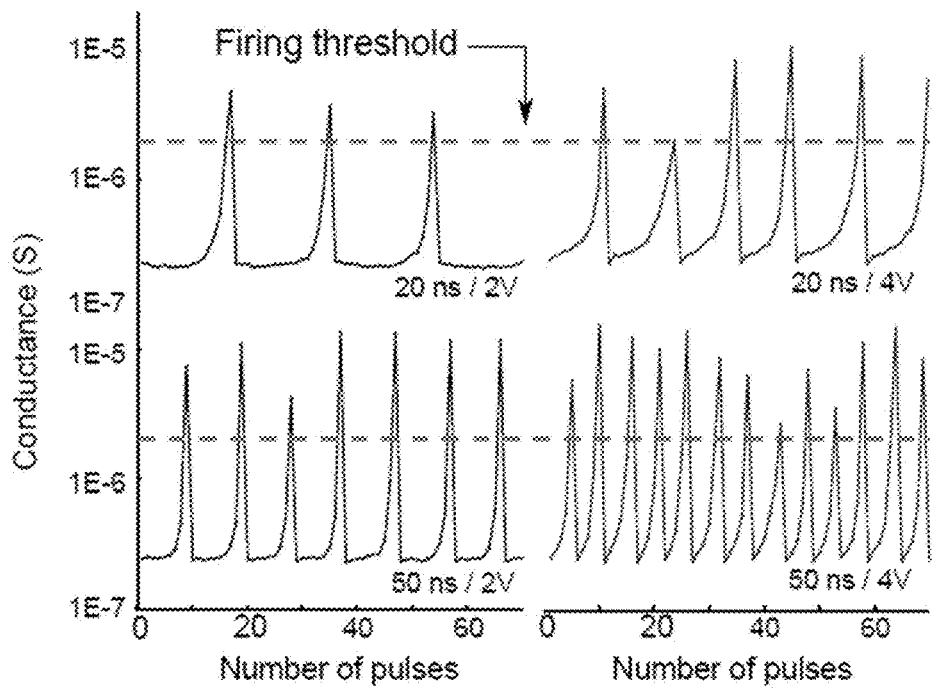

The neuron circuits 10 in embodiments below use the phase configuration within a PCM cell 20 to store the neuron state. The neuron input signals effect reduction in cell resistance to vary the neuron state as described above. The neuron output circuit 15 detects cell resistance to measure the neuron state. When cell resistance decreases below a threshold level, the neuron fires and the neuron output circuit 15 supplies a neuron output signal (spike) to neuron output 12. The neuron output circuit then also applies a reset pulse to the cell to reset the cell resistance to the initial, pre-accumulation neuron state. FIGS. 4a through 4c show operating characteristics of such a PCM neuron 10. These experimental results were obtained with mushroom-type PCM cells 20 fabricated in the 90 nm technology node. FIG. 4a shows a typical reset pulse and a sequence of crystallizing pulses applied as neuron input signals, as well as the resulting electrical current flowing through PCM cell 20. FIG. 4b shows the evolution of neuron state, in terms of electrical conductance of the PCM cell, as a function of the number of crystallizing pulses. After a certain number of pulses, the conductance gradient rises sharply and causes the neuron state to cross the firing threshold. This rapid onset of the firing event is enabled by a positive feedback mechanism inherent in the PCM crystallization dynamics, bearing resemblance to the generation of a voltage-gated action potential in biological cells. After application of the reset pulse, the operating cycle repeats with a firing rate that can be controlled by the power and the duration (width) of the crystallizing pulse. This is illustrated in FIG. 4c which illustrates variation in firing rate for different combinations of crystallizing pulse width (20 ns and 50 ns) and amplitude (2V and 4V). The integrate-and-fire dynamics of these PCM neurons are consistent across time scales ranging from extremely high-frequency updates (pulse periods of 102 ns, corresponding to a 10 MHz update frequency) to biologically relevant time scales and above (pulse periods of 108 ns, corresponding to a 10 Hz update frequency). PCM cells have been shown to sustain more than 1012 switching cycles, which would correspond to more than 300 years of operation at 100 Hz update frequency.

In the population 3 of PCM neurons 10, the PCM cells not only provide the (sole) mechanism for storing the neuron state, but also provide the intra-neuron and inter-neuron stochasticity which is exploited in processing device 1. The origins of this stochastic behaviour are explained in the following.

The variability in the integrate-and-fire response across a population of multiple PCM neurons arises predominantly from the structural variability associated with the fabrication process. The physical attributes of the cell, such as the thickness of the phase-change layer and electrode dimensions, often vary across the wafer, and lead to differences in the temporal integration characteristics and the associated firing response. This structural variability is likely to increase further when the devices scale into future technology nodes. A more intricate phenomenon, however, is the stochastic firing response of individual phase-change-based neurons. Evidence suggests that its origin relies on the fact that the amorphous region created via the melt-quench process has a different atomic configuration after each reset process. This happens because the high mobility of the atoms in the molten state ensures that even the slightest variations in the initial conditions or in the pulse characteristics will result in the formation of a new amorphous glass state during the glass transition. Ultimately, the different glass states lead to differences in the growth velocity arising from changes in the viscosity and diffusivity in the glass phase. The amorphous regions are also likely to have different distributions of crystalline nuclei which lead to different crystallization rates during the application of the crystallizing pulses and different firing response of the neuron. Yet another source of the stochastic firing response is the formation of additional crystal nuclei during the application of the accumulation pulses. For example, the crystallization mechanism in Ge2Sb2Te5 (GST) is nucleation-dominated and nucleation again is inherently stochastic, with a strongly temperature-dependent probability of crystal nuclei formation.

Figure 5A:
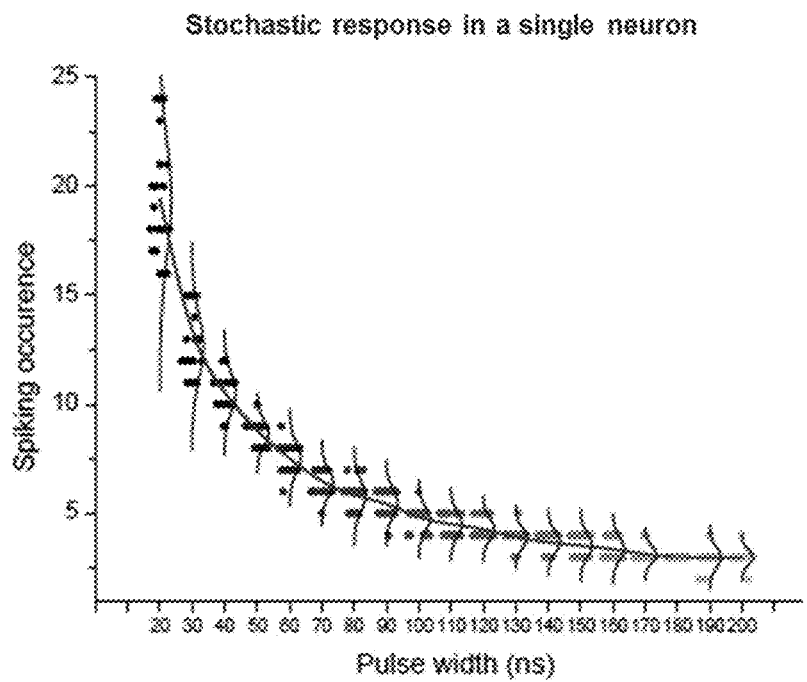
FIGS. 5a and 5b illustrate stochastic properties of PCM neuron circuits.
Figure 5B:
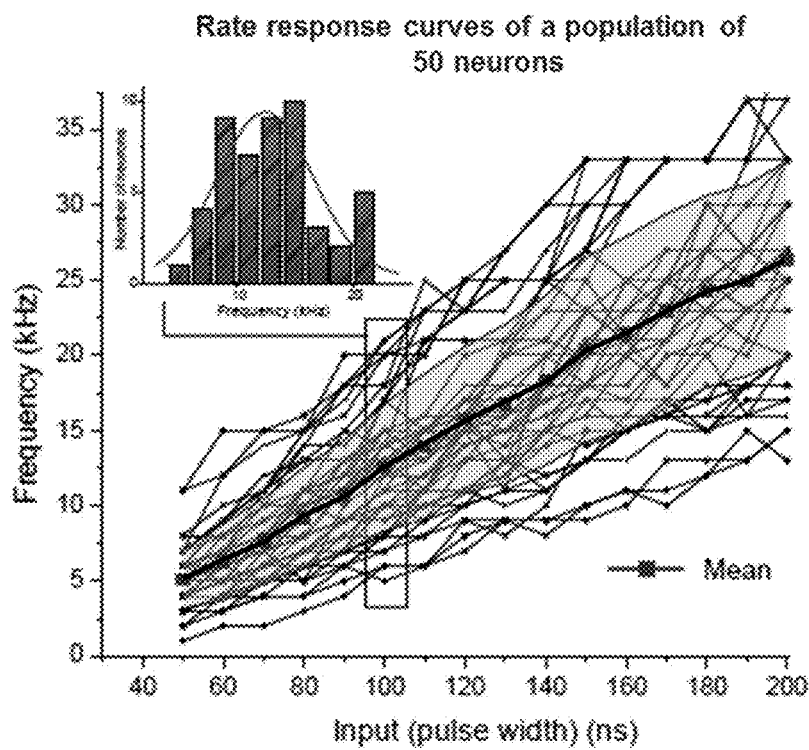

Owing to the inherent stochasticity, multiple integrate-and-fire cycles in a single PCM neuron 10 lead to a distribution of the spiking occurrence times. This is illustrated in FIG. 5a which indicates the number of pulses required to fire the neuron over twenty trials for different crystallizing pulse widths of fixed duration. The required number of pulses is seen to vary and is symmetrically distributed around a mean that corresponds to the inverse of the mean firing rate of the neuron. The variance of the distribution tends to decrease with the increasing pulse power and width. In the population 3 of PCM neurons 10, a combination of the inherent stochasticity of individual neurons and the inter-neuron variability results in consistent population dynamics, as evidenced by measurements shown in FIG. 5b. This shows the firing rate response curves of a sample of fifty PCM neurons. The bold trace indicates the mean firing rate of the population, and the shaded region indicates the response envelope based on standard deviation. The inset shows the response distribution of the individual neurons for a 100 ns input pulse width. The inter-neuron variability leads to a distribution of firing rates across the population, while the individual neurons retain their characteristic linear rate response and inherent stochastic firing response. The individual firing rates are distributed symmetrically around the mean population firing rate, which is linear and increases with the input signal strength.

Exemplary embodiments of PCM neuron circuits 10 will now be described with reference to FIGS. 6 through 10. These neuron circuits can be fabricated as integrated nano-electronic circuits using well-known material processing techniques. For operation of these neuron circuits in processing device 1, the input signal generator 4 is adapted to generate neuron input signals each comprising (at least) a write portion VW, which provides the programming pulse for programming cell resistance, and a read portion VR. The neuron output circuit 15 of each neuron circuit includes a read circuit for producing a read signal dependent on the cell resistance, and an output terminal for providing the neuron output signal in dependence on the read signal. The neuron output circuit further comprises a storage circuit, for storing a measurement signal dependent on the read signal, and a switch set. The switch set is operable to supply the read signal to the storage circuit during application of the read portion of each neuron input signal to the memory cell, and, after application of the read portion, to apply the measurement signal in the neuron circuit to enable reset of the cell resistance to the initial, pre-accumulation neuron state in response to cell resistance traversing the aforementioned threshold.

Figure 6:
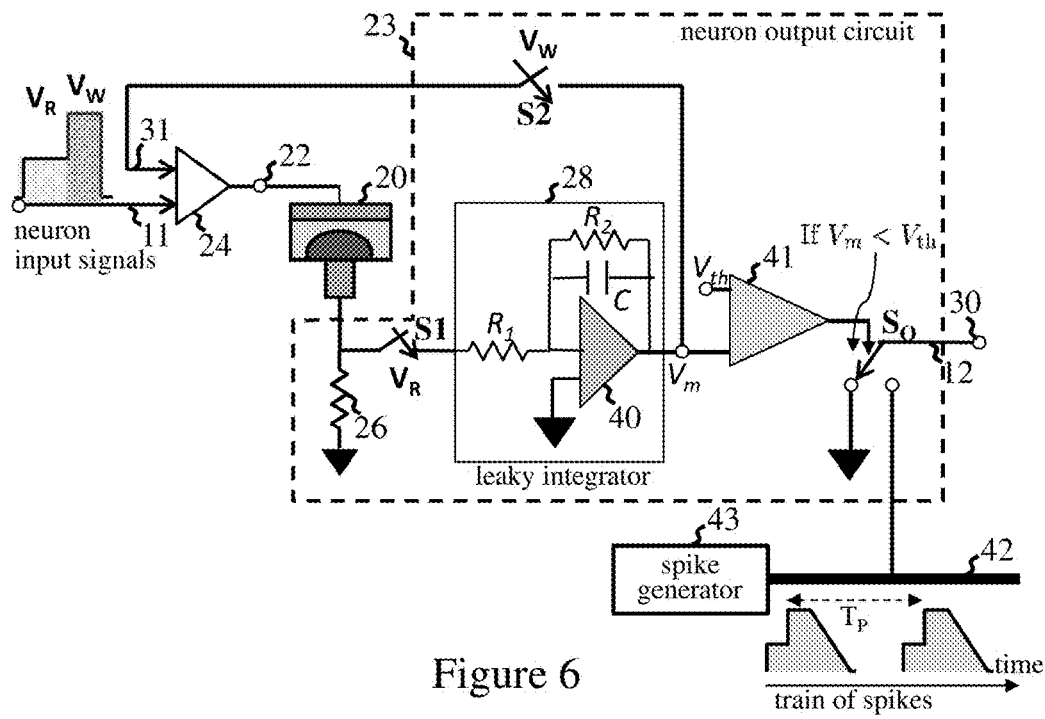
FIG. 6 illustrates one embodiment of a PCM neuron circuit.

A first embodiment of neuron circuit 10 is shown in FIG. 6. The neuron circuit includes a PCM cell 20 having an input terminal 22 connected to the upper cell electrode, and a neuron output circuit indicated generally at 23. Neuron input signals are supplied to input terminal 22 from neuron input 11 via an adder 24. The neuron input signals comprise a read portion and a write portion. In this example, the neuron input signals have a simple stepped shape with an initial read portion VR, and a subsequent write portion VW. The read portion VR has an amplitude lower than the threshold voltage required for phase-change The read circuit of this embodiment comprises a read resistance 26 connected between PCM cell 20 and a reference terminal, here a signal earth. The read signal is provided by voltage across the read resistance which varies inversely with cell resistance. The switch set in this embodiment comprises switches S1 and S2. Read resistance 26 is selectively connectable via first switch S1 to a storage circuit in the form of leaky integrator circuit 28. The leaky integrator 28 can be implemented by an operational amplifier 40 connected to a capacitor C and resistors R1 and R2 as shown. When connected via switch S1, the integrator 28 integrates the read signal and stores a measurement signal Vm dependent thereon. A comparator 41 compares the measurement signal Vm with a firing threshold represented by voltage Vth the figure. An output switch So is connected between comparator 41 and an output terminal 30 providing neuron output 12. Switch So connects the output terminal to ground if Vm≤Vth. When resistance of cell 20 drops below a threshold value, the measurement signal Vm will exceed the firing threshold Vth. The comparator then generates a control signal triggering switching of So to connect the output terminal to a signal pathway 42 on which a periodic spike train is generated by a spike generator circuit 43. Spike generator circuit 43 can generate spikes with a periodicity Tp which is chosen according to the leakage time of integrator 28 to ensure that at least one spike will be supplied to output terminal 30 while switch So is closed. The signal pathway 42 in this arrangement can be shared between multiple neuron circuits in population 3.

The switches S1 and S2 are configurable in response to a neuron input signal. Switch S1 is operable in response to the read portion VR to supply the read signal to integrator 28 during application of the read portion to cell 20. Switch S2 is operable in response to the write portion VW to supply to the measurement signal Vm to an input 31 of adder 24 during application of the write portion to the cell 20. The measurement signal Vm is thus added to the write portion VW and the resultant combined signal is supplied to cell input 22. The measurement signal Vm depends inversely on resistance of PCM cell 20, increasing as cell-resistance decreases. The circuitry is adapted such that, when the cell-resistance drops below the threshold level, the measurement signal Vm is large enough to effect resetting of the cell to its high-resistance state. The measurement signal Vm also causes switch S0 to provide the neuron output signal (spike) to output terminal 30.

Figure 7:
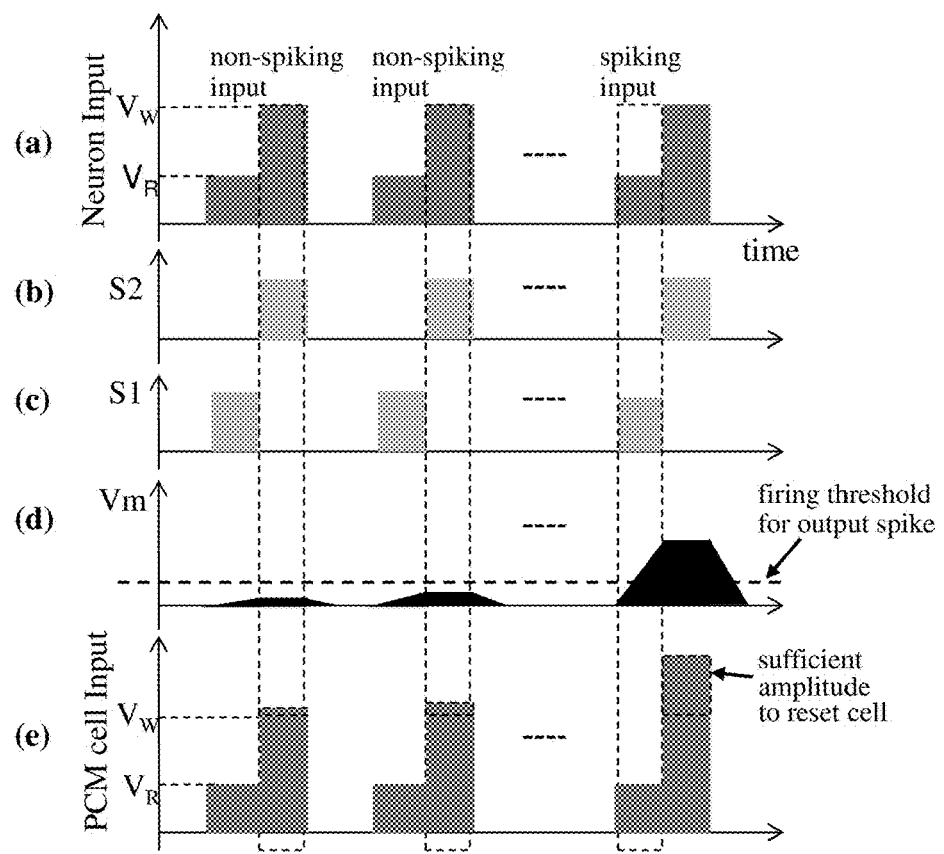
FIG. 7 indicates operation of the FIG. 6 neuron circuit.

Operation of the neuron circuit is illustrated by the signal timing diagram of FIG. 7. The top section (a) of this diagram illustrates a series of neuron input signals applied to input 11. The shaded regions in sections (b) and (c) indicate closure timings for switches S2 and S1 corresponding to write and read portions VW and VR respectively of the input signals. Section (d) indicates the measurement signal Vm and section (e) indicates the resulting cell input at terminal 22. The measurement signal Vm is accumulated during read portions VR. The resulting signal is stored by integrator 28 and added to the following write portion at cell input 22. The stored measurement signal Vm progressively increases with successive input signals as the cell-resistance is progressively reduced. The leakiness of integrator 28 allows the stored signal Vm to leak away with time. The time constant of integrator 28 can be set such that the stored signal dissipates between successive input signals. The measurement signal Vm need only be stored substantially for the duration of the immediately-following write portion VW here. After sufficient input signals have been applied to the cell, the next input signal (the "spiking input" on the right of the figure) will cause resistance of cell 20 to drop below the threshold. The measurement signal Vm will then exceed the firing threshold Vth in neuron output circuit 23, triggering generation of the output spike at terminal 30. When this measurement signal Vm is added to the cell input as indicated in section (e), the amplitude of the cell input signal is sufficient to reset the cell.

Figure 8:
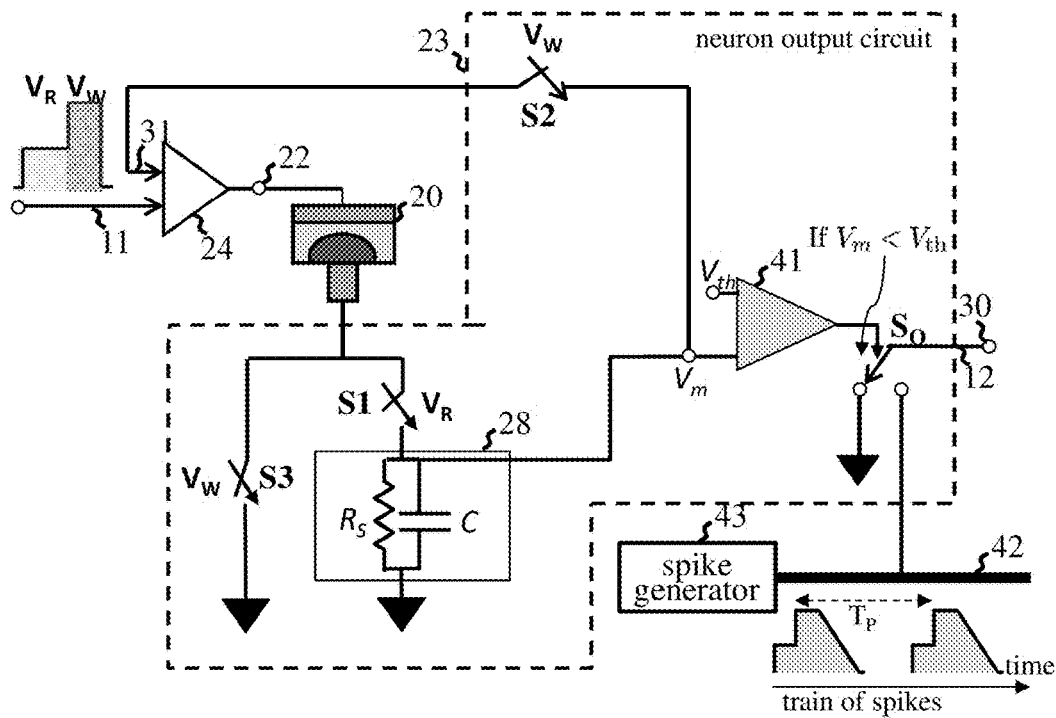
FIGS. 8 through 10 illustrate further embodiments of PCM neuron circuits.

FIG. 8 shows another embodiment of a PCM neuron circuit. The circuit corresponds generally to that of FIG. 6, and corresponding components are indicated by like references. In this circuit, however, the read circuit is provided by read resistance RS which, together with capacitor C, forms part of leaky integrator circuit 28. The read signal is thus supplied to integrator 28 when switch S1 closes as before. The switch set in this embodiment includes a third switch S3 which is operable in response to the write portion VW of each neuron input signal to ground cell 20 during the cell-write operation. This prevents the stored voltage Vm across capacitor C from reducing the voltage dropped across cell 20 for the write operation.

Figure 9:
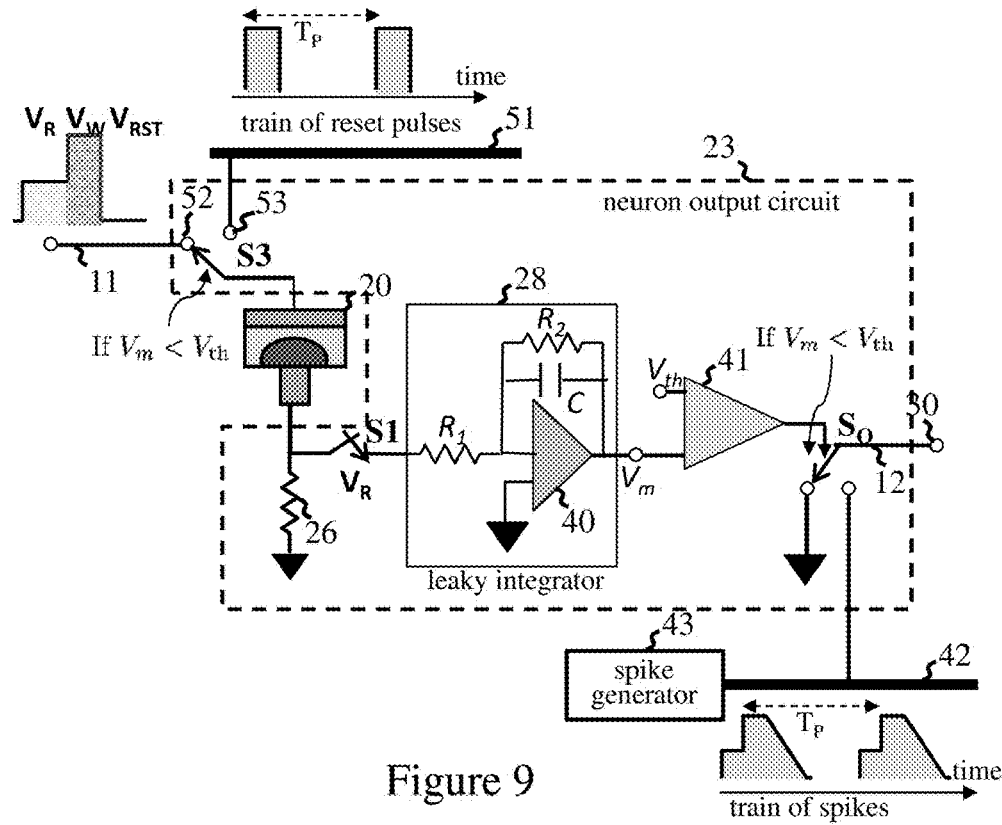

FIG. 9 shows another neuron embodiment. The neuron input signal here includes a reset portion, as indicated by signal portion VRST (which may be a zero-volt signal level) following the write portion VW. Reset portion VRST defines a time period for application to the PCM cell of an externally-generated reset pulse from a periodic train of reset pulses generated on a signal pathway 51 which can be shared between multiple neuron circuits in the population. Circuit components corresponding to those of FIG. 6 are again indicated by like references. Here, the circuitry has two input terminals. The first input terminal 52 receives the neuron input signals, and the second input terminal 53 is connected to signal pathway 51. A switch S3 is operable in response to the control signal generated by comparator 41 when Vm>Vth. Switch S3 normally connects the first input terminal 52 to cell 20. In response to the control signal from comparator 41, the switch S3 switches to connect the second input terminal 53 to the cell. In this state, a reset pulse from signal pathway 51 is applied to the cell. The cell is thus reset during the reset portion VRST of the input signal which triggers an output spike.

Figure 10:
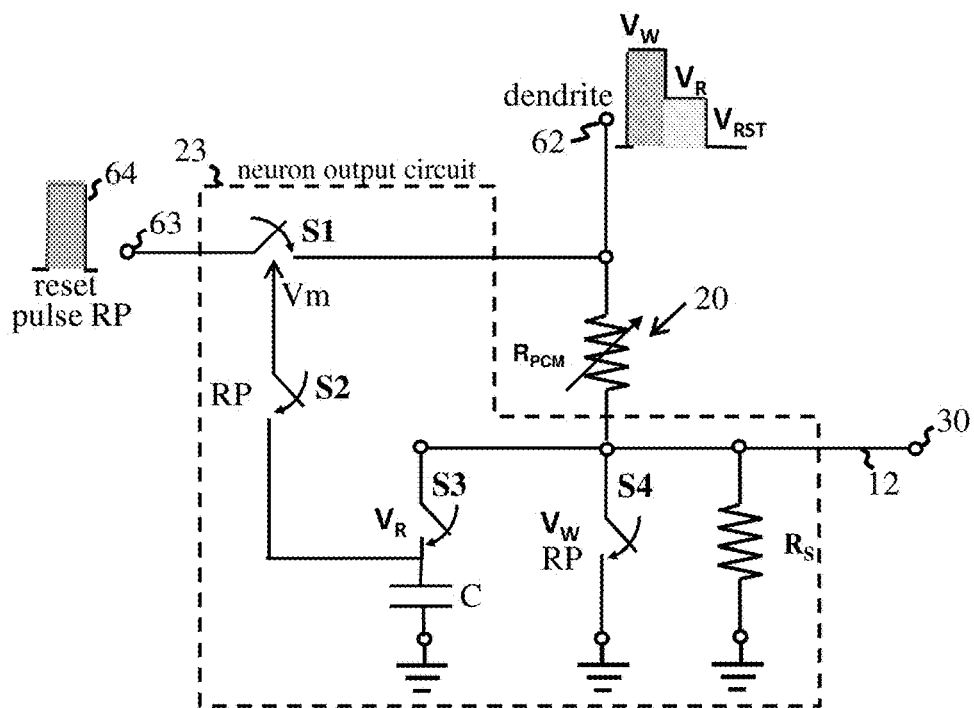

FIG. 10 shows a further neuron embodiment. The PCM cell 20 of this embodiment is indicated by variable resistance RPCM. The neuron circuitry has two input terminals 62, 63. The first input terminal 62 provides neuron input 11 and receives the neuron input signals. The neuron input signals in this example have an initial write portion VW, a read portion VR, and a reset portion VRST. The second input terminal 63 receives a reset signal, indicated by reset pulse (RP) 64, for resetting the cell from the low-resistance state to the high-resistance state. As in FIG. 9, the reset pulse may be provided by a periodic train of reset pulses on a signal pathway connected to input terminal 63. The read circuit comprises a read resistance RS, and the storage circuit comprises a capacitor C which is selectively connectable across read resistance RS. The neuron output terminal 30 is connected to read resistance RS. The switch set here includes switches Si and S2 which enable the cell-reset operation. The first switch S1 is operable, in response to the measurement signal Vm stored by capacitor C, to connect the second input terminal 63 to cell 20. The second switch S2 is operable, in response to application of a reset pulse RP at input terminal 73, to apply the measurement signal Vm to the first switch S1. A third switch S3 is operable, in response to the read portion VR of a neuron input signal, to connect capacitor C across read resistance RS and thus to supply the read signal to the capacitor during application of the read portion VR to cell 20. A fourth switch S4 is connected between cell 20 and ground. Switch S4 is operable, in response to each of the reset pulse RP and the write portion VW of each neuron input signal, to short the read resistance RS. This prevents generation of an output signal at terminal 30 during the write and reset phases of circuit operation.

In operation of this neuron circuit, cell-resistance is progressively reduced by application of the write portions VW of successive neuron input signals. During application of the read portion VR, cell resistance is high before the firing threshold is reached and negligible current flows through read resistance RS, giving negligible output at terminal 30. However, when the cell resistance drops below the firing threshold, a large current flows through RS, producing a spike at output terminal 30. The read signal is also supplied to capacitor C which stores the measurement signal Vm for use in the subsequent reset phase. Before cell resistance drops below the firing threshold, the measurement signal Vm is insufficient to close switch S1, so no reset signal is applied to the cell. After firing, the resulting measurement signal Vm is sufficient to close switch S1, and a reset pulse RP is applied to the cell.

Figure 11:
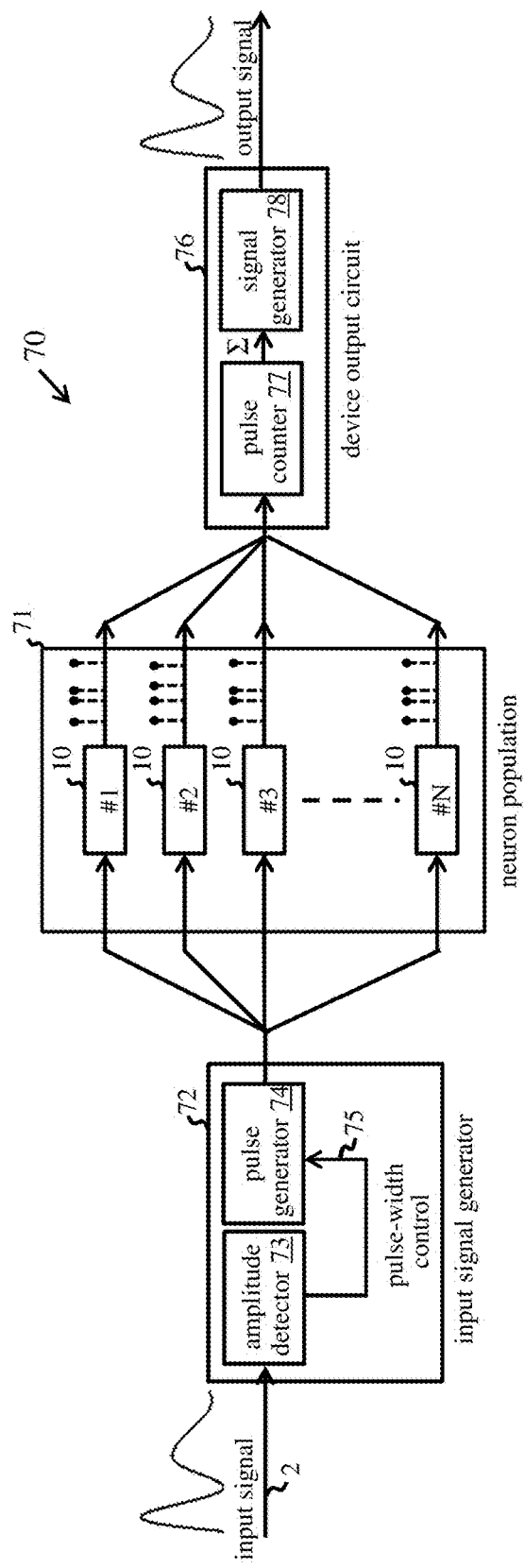
FIG. 11 illustrates a neuromorphic processing device for high-frequency signal representation in an embodiment of the invention.

One computational capability enabled by the population of stochastic neurons in processing device 1 is the effective sampling and representation of signals that are orders of magnitude faster than the time constants of individual neurons. FIG. 11 shows an embodiment of the processing device for high-frequency signal representation. The processing device 70 includes a neuron population 71 as described for FIG. 2. The input signal generator 72 of this embodiment is adapted to periodically generate neuron input signals which are supplied to all neuron circuits 10 in the population. The input signal generator comprises an amplitude detector 73 and a pulse generator 74. Amplitude detector 73 receives the input data signal on device input 2 and detects amplitude of the input signal with a sampling period TS. A control input 75 provides a control signal indicative of the detected amplitude to pulse generator 74. The pulse generator 74 periodically generates neuron input signals which are supplied to all neuron circuits 10 in population 3 at timings TS. At least one attribute of each neuron input signal is controlled in dependence on the input signal amplitude indicated by control input 75. In this example, the width of the programming pulse (e.g. of write portion VW in the circuit examples above) is varied with amplitude of the input signal. The device output circuit 76 is connected to neuron output circuits 15 of all neurons 10 in population 71. Device output circuit 76 comprises a pulse counter 77 and a signal generator 78. The pulse counter 77 counts the neuron output signals (spikes) received from neurons 10 in each time window TS, and supplies the total count Σ for each TS to signal generator 78. The signal generator 78 generates the output signal of processing device 70, and controls the amplitude of the device output signal in dependence on the count Σ from pulse counter 77. The amplitude of the device output signal thus depends on the rate of receipt of neuron output signals from population 71.

By using a sufficient number N of neurons 10 in population 71, the processing device 70 can produce an output signal which substantially reproduces the input data signal. This number N may depend on various factors such as the input signal form, the particular characteristics of resistive memory cells 14, and the design of neuron circuits 10. However, successful operation of processing device 70 is demonstrated by experimental results shown in FIGS. 12a through 12c. The results shown were obtained with populations of up to N=500 neurons. The mean firing rate of the population was between 5 kHz and 15 kHz for input pulse widths ranging from 50 ns to 100 ns, and no individual neuron had an actual firing rate higher than 20 kHz. The input signal was a triangular waveform of base frequency 10 kHz, i.e., a signal whose frequency components all lie above the Nyquist sampling limit of any neuron in the population. An accurate representation of the sharp "peaks" at the extrema of the input signal is particularly challenging as it requires capturing the higher-harmonic components at frequencies that are odd multiples of the base frequency, i.e., at 30 kHz (the first harmonic), 50 kHz (the second harmonic) and higher. This renders an accurate representation of the input signal practically impossible with a single neuron, and challenging in populations of deterministic neurons.

Figure 12A:
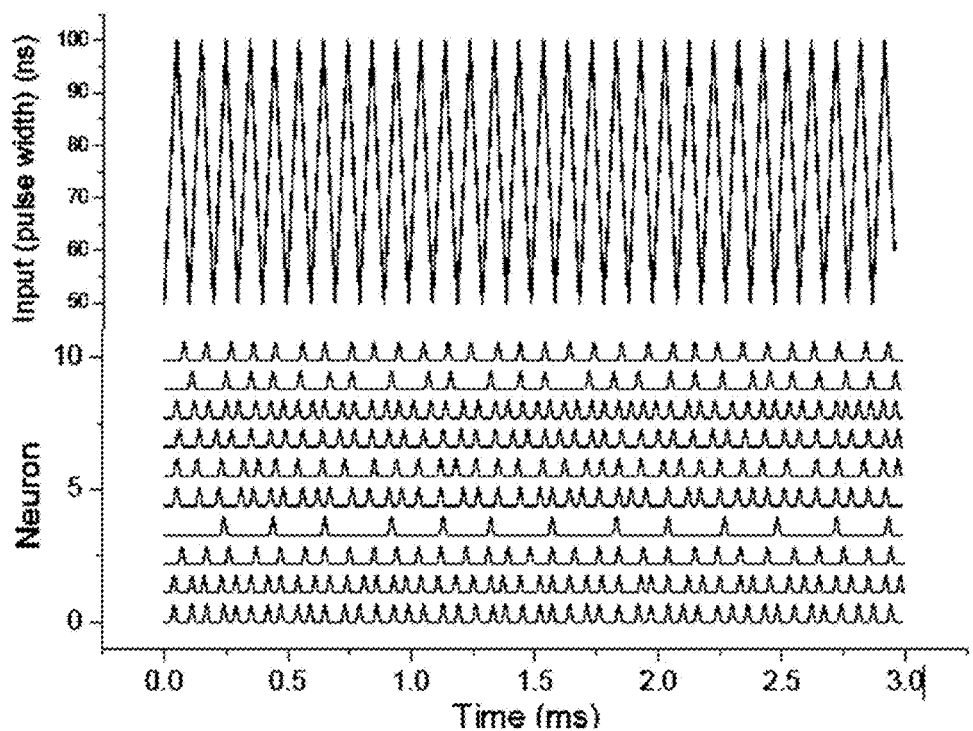
FIGS. 12a through 12c illustrate operating results for the FIG. 11 device.
Figure 12B:
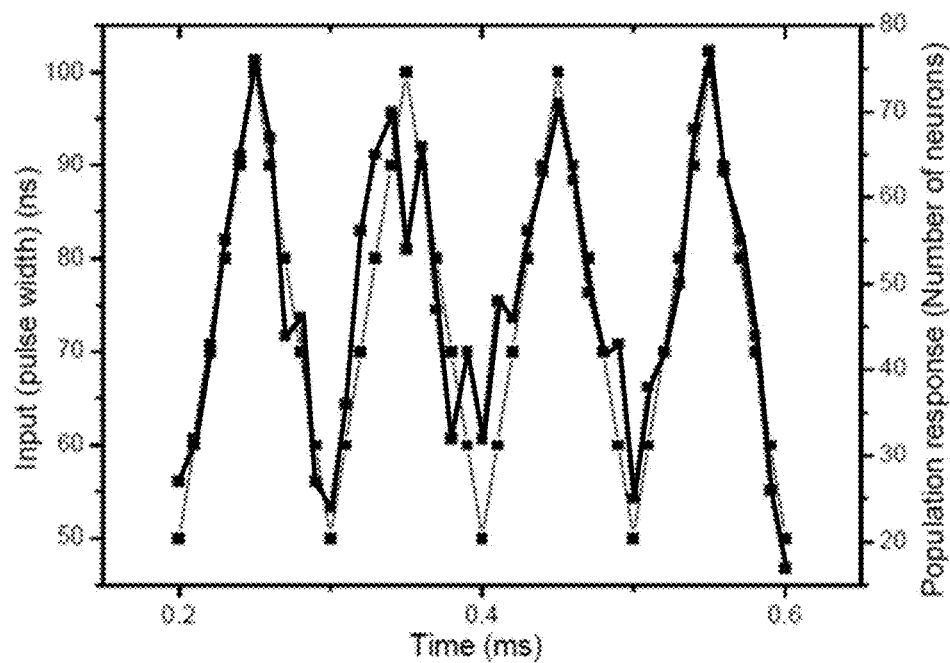
Figure 12C:
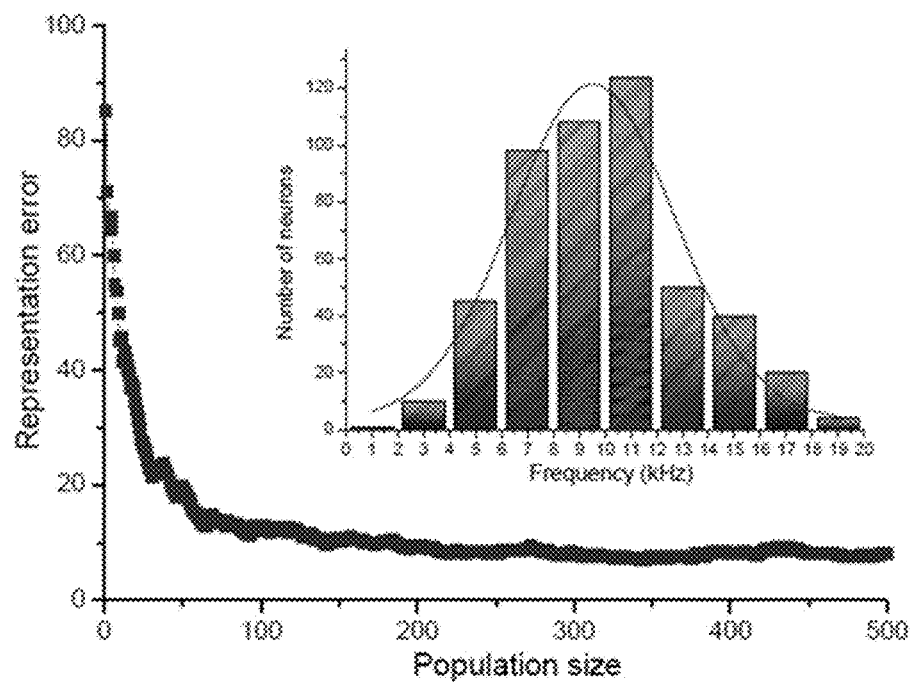

The device input signal is represented in the upper section of FIG. 12a in terms of programming pulse width corresponding to signal amplitude. This signal has period 0.1 ms (base frequency 10 kHz) corresponding to pulse width values in the range 50 ns to 100 ns. Pulses were applied to all neurons in the population every TS=0.01 ms. The lower section of FIG. 12a shows the activity (spike timing) of the first 10 neurons in the population. FIG. 12b shows the device output signal for N=500 neurons. The output signal (population response—right ordinate axis) is shown in bold, overlying the input signal (left ordinate axis). The population response captures the key characteristics of the input signal despite the fact that all neurons in the population have their actual spiking frequency below the Nyquist rate. The average response is only at half the Nyquist frequency and one fifth of the second harmonic. FIG. 12c indicates the error in representation of the input signal for varying population size N. For N=500 neurons, the inset shows the distribution of the actual spiking frequency across the neuron population when the input signal is applied. By progressively increasing the size of the stochastic neuron population, starting at a small subgroup of neurons, the error in representation of the input signal is dramatically reduced. A significant decrease in the representation error was observed for populations with as few as several tens of neurons, and the representation fidelity stabilized for populations with hundreds of neurons. By increasing the population size, the absolute number of neurons responding to any particular input value increases, which renders the population response more robust for larger populations. Simulations predict that the representation error can be further improved by increasing the stochasticity of the individual neurons, increasing the inter-neuron variability, decreasing the time constant of the individual neurons, and increasing the population size.

It can be seen that the stochastic dynamics of the PCM neurons 10 enable sub-Nyquist sampling and the representation of high-bandwidth signals in processing device 70 without additional computational burdens. This provides the foundation for further processing of these signals within a neuromorphic computing system, and represents a significant step towards the fabrication of transistor-less neuromorphic systems with extremely high integration densities. The capability of emulating neuronal noise and stochastic neuronal dynamics directly on the device level facilitates the creation of dense neural populations for robust representation of signals and neural states, and fosters development of neuromorphic computers with highly collocated memory and processing units. A particularly advantageous property for PCM neurons is the scalability of phase-change cells down to units of nanometers, coupled with the fast and well-understood dynamics of the amorphous-crystalline transition. The speeds at which PCM neurons operate will be particularly useful in applications that use spiking neural networks to process millions of fast data streams, e.g. in electronic trading, the real-time analysis of social media platforms, and in scientific computing. Processing with populations of stochastic neurons can increase the robustness to hardware failures, and their ability to represent high-speed signals with neurons that are orders of magnitudes slower will contribute significantly to decreasing power consumption and increasing endurance. This is particularly true with PCM neurons where resetting the neuron is the most costly operation in terms of both energy and material wear. The non-volatile nature of phase-change materials also enables low leakage currents, further lowering the power and energy requirements of spiking-based computation.

Various changes and modifications can of course be made to the exemplary embodiments described above. For example, the FIG. 11 device can be readily adapted to provide for sub-sampling/filtering of input signals, e.g. by varying the number of neuron circuits 10, and/or the sampling period of input signal generator 72, and/or operational features, such as sampling period, of device output circuit 76. In some embodiments, the device output circuit may also perform some filtering operation on the neuron output signals, e.g. via thresholding, buffering or calculating a moving average, etc. Appropriate modifications to the device circuitry will be apparent to those skilled in the art.

In alternative embodiments, neuron assemblage 3 may contain a plurality of component populations, or sub-assemblages, of neuron circuits. The input signal generator 4 may then be adapted to generate neuron input signals for neuron circuits of at least one sub-assemblage. Similarly, device output circuit 5 may be connected to neuron output circuits of at least one sub-assemblage. For example, different sub-assemblages may contain different numbers of neurons and/or otherwise offer different stochastic characteristics, e.g. due to differing memory cell design and/or variability, or differing neuron circuit properties such as time constants. One or more different sub-assemblages may be selected for operation as required in a given application. This selection may, for instance, be controlled via stochasticity control input 7 in FIG. 1. Alternatively or in addition, input signal generator 4 may be responsive to neuron output signals, via feedback input 6 of FIG. 1, to adaptively select different sub-assemblages to achieve a desired output response. Stochastic behavior of a population may also be varied by adjusting neuron input signals to exploit variation in programming or other characteristics of resistive memory cells 14, e.g. in response to stochasticity control input 7 and/or feedback control 6. Reset pulses with different amplitude/trailing edge, etc., and/or crystallizing pulses of different amplitude may be generated in response to control input 7 to obtain different stochastic responses from memory cells. Stochasticity control input 7 may therefore be used to control stochasticity of the assemblage 3 in device 1.

In some applications, different neuron sub-assemblages may be selectively interconnectable, e.g. in cascade, whereby neuron outputs in one population provide input signals to neurons in another. Applications may also be envisaged where neurons in one or different populations are interconnected. Any single neuron may then receive input signals from multiple other neurons in the assemblage. Neurons may be interconnected via synapse circuits for example. Various memristor-based synapse circuits are known in the art. In general, combining embodiments of the invention with memristor-based synapses will contribute to decreasing the number of active elements and increasing the density of massively-parallel computing systems.

While illustrative examples are described above, input signal generator 4 may generate various forms of neuron input signal and may vary any attribute(s), such as amplitude, shape, power, duration, trailing-edge shape/duration, etc., of a programming pulse, and/or the number/attributes of component pulses of a composite programming pulse. Such attribute(s) may be controlled based on any attribute or combination of attributes of the device input signal, including amplitude, frequency, intensity, etc., of the input signal or components thereof. In embodiments where the data signal represents images or text, for instance, such input signal attributes may correspond to the appearance of certain patterns, or other temporally-dependent features of the data represented. Different neuron input signals may be supplied to different subsets of neurons in the assemblage, e.g. to different sub-assemblages, in some embodiments. The device output circuit 5 may also control any desired attribute (s) of the output signal in dependence on any attribute of the collective neuron output signals. Particular constructions and operational features can thus be selected as desired for a given application.

PCM cell designs other than the mushroom cell type can be utilized in neuron circuits 10, as well as other resistive memory cells. Some examples include resistive RAM (RRAM) cells such as conductive bridge RRAM cells, oxide or metal-oxide RRAM cells, and carbon RRAM cells.

Examples have been described in which cell resistance is reduced by programming pulses and the neuron fires when cell resistance drops below a threshold. Other embodiments might be based on resistive memory cells operable such that cell resistance is progressively increased by successive programming pulses and the neuron fires when the cell resistance increases above a threshold. Any resistive memory cell, which may include bipolar devices, in which resistance can be progressively increased may be used in such embodiments, one example being CBRAM (conductive bridge RAM) cells. Suitable modifications to the neuron circuit examples above will be apparent to those skilled in the art. For example, the read signal supplied to integrator 28 in FIG. 6 may be based on voltage dropped across cell 20 rather than that across read resistance 26.

In general, features of different embodiments may be interchanged as appropriate. Also, where a component is described herein as connected to another component, in general such components may be connected directly or indirectly, e.g. via intervening components, unless otherwise indicated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A neuromorphic processing device comprising:
   a device input for receiving an input data signal;
   an assemblage of neuron circuits each comprising a resistive memory cell arranged to store a neuron state, indicated by cell resistance, and to receive neuron input signals for programming cell resistance to vary the neuron state, and a neuron output circuit for supplying a neuron output signal in response to cell resistance traversing a threshold;
   an input signal generator, connected to the device input and the assemblage of neuron circuits, for generating neuron input signals for the assemblage in dependence on the input data signal; and
   a device output circuit, connected to neuron output circuits of the assemblage, for producing a device output signal dependent on neuron output signals of the assemblage, whereby the processing device exploits stochasticity of resistive memory cells of the assemblage.

2. A device as claimed in claim 1 wherein the input signal generator is adapted to periodically generate neuron input signals for neuron circuits of the assemblage, and to control at least one attribute of each neuron input signal in dependence on the input data signal.

3. A device as claimed in claim 2 wherein each neuron input signal comprises a programming pulse and wherein the input signal generator is adapted to control at least one programming pulse attribute in dependence on at least one time-dependent attribute of the input data signal.

4. A device as claimed in claim 2 wherein the device output circuit is adapted to control at least one attribute of the device output signal in dependence on rate of receipt by the device output circuit of neuron output signals from the assemblage.

5. A device as claimed in claim 4 wherein the neuron output circuit of each neuron circuit is operable to control reset of the cell resistance to an initial neuron state in response to cell resistance traversing said threshold.

6. A device as claimed in claim 5 wherein the input signal generator is adapted to generate neuron input signals each comprising a write portion, for programming said cell resistance to vary said neuron state, and a read portion, and wherein the neuron output circuit of each neuron circuit comprises:
   a read circuit for producing a read signal dependent on said cell resistance;
   an output terminal for providing said neuron output signal in dependence on said read signal;
   a storage circuit for storing a measurement signal dependent on said read signal; and
   a switch set operable to supply the read signal to the storage circuit during application of the read portion of each neuron input signal to the memory cell, and, after application of the read portion, to apply the measurement signal in the neuron circuit to enable reset of the cell resistance to said initial neuron state in response to cell resistance traversing said threshold.

7. A device as claimed in claim 5 wherein:
   the input signal generator is adapted to control at least one attribute of each neuron input signal in dependence on amplitude of the input data signal; and
   the device output circuit is adapted to control amplitude of the device output signal in dependence on said rate of receipt of neuron output signals.

8. A device as claimed in claim 7 wherein the assemblage comprises sufficient neuron circuits to substantially reproduce the input data signal in the device output signal.

9. A device as claimed in claim 2 wherein the input signal generator is adapted to periodically generate neuron input signals for all neuron circuits in the assemblage, and the device output circuit is connected to neuron output circuits of all neuron circuits in the assemblage.

10. A device as claimed in claim 1 wherein:
    said assemblage comprises a plurality of sub-assemblages of neuron circuits;
    the input signal generator is adapted to generate neuron input signals for neuron circuits of at least one sub-assemblage; and
    the device output circuit is connected to neuron output circuits of at least one sub-assemblage.

11. A device as claimed in claim 1 wherein the input signal generator is responsive to neuron output signals of the assemblage and adapted to control generation of neuron input signals for the assemblage in dependence on said neuron output signals.

12. A device as claimed in claim 1 wherein the input signal generator is responsive to a stochasticity control input and adapted to control generation of neuron input signals for the assemblage, in dependence on said control input, to control stochasticity of the assemblage.

13. A device as claimed in claim 1 wherein said resistive memory cell comprises a phase-change memory cell.

14. A device as claimed in claim 13, the device being adapted such that said neuron input signals effect reduction in cell resistance to vary said neuron state, wherein each neuron output circuit is adapted to supply a said neuron output signal in response to cell resistance decreasing below said threshold.

* * * * *